(12) United States Patent
Chakraborty

(10) Patent No.: US 9,602,054 B2
(45) Date of Patent: Mar. 21, 2017

(54) SYSTEM AND METHOD FOR RECONFIGURABLE PHASE SHIFTER AND MIXER

(71) Applicant: Texas Instruments Incorporated, Dallas, TX (US)

(72) Inventor: Sudipto Chakraborty, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/930,210

(22) Filed: Nov. 2, 2015

(65) Prior Publication Data

US 2017/0019067 A1 Jan. 19, 2017

Related U.S. Application Data

(60) Provisional application No. 62/192,796, filed on Jul. 15, 2015.

(51) Int. Cl.
| | |
|---|---|
| *H03H 11/16* | (2006.01) |
| *H03D 7/14* | (2006.01) |
| *H03H 11/20* | (2006.01) |
| *H03K 5/01* | (2006.01) |
| H03K 5/00 | (2006.01) |

(52) U.S. Cl.
CPC .......... *H03D 7/1441* (2013.01); *H03H 11/20* (2013.01); *H03K 5/01* (2013.01); *H03K 2005/00286* (2013.01)

(58) Field of Classification Search
None
See application file for complete search history.

(56) References Cited

U.S. PATENT DOCUMENTS

| | | | | |
|---|---|---|---|---|
| 7,425,858 B1* | 9/2008 | Daga | .................... | H03H 11/265 327/149 |
| 7,928,788 B2* | 4/2011 | Jiang | ..................... | H03B 28/00 327/231 |
| 7,961,025 B2* | 6/2011 | Rylov | .................... | H03H 11/20 327/231 |
| 2008/0252387 A1* | 10/2008 | Higashi | ................ | H03K 3/0322 331/57 |

(Continued)

*Primary Examiner* — Lincoln Donovan
*Assistant Examiner* — Khareem E Almo
(74) *Attorney, Agent, or Firm* — John R. Pessetto; Charles A. Brill; Frank D. Cimino

(57) ABSTRACT

An analog circuit for generating a periodic signal at a selected phase, including one or more phase interpolators that receive orthogonal differential RF signals and a pair of differential gain signals. The differential in-phase RF signal is applied at respective gates of tail transistors, and a first differential gain signal is applied across gates of a transistor pair coupled to each of the tail transistors. The quadrature-phase RF signal and a second differential gain signal is similarly applied to another quad of transistors (i.e., pair of transistor pairs) and associated tail transistors. A load connected to the one transistor in each pair receives the output signal, at a phase corresponding to a ratio of the first and second gain signals. The gain signals may be DC or AC, which allows configuration of the circuit as a phase shifter or an upconversion mixer, and the load may be presented by a transform in which the phase also depends on the relative coupling from the in-phase and quadrature-phase sides of the phase interpolator.

20 Claims, 9 Drawing Sheets

(56) References Cited

U.S. PATENT DOCUMENTS

| | | | | |
|---|---|---|---|---|
| 2009/0195286 A1* | 8/2009 | Rylov | ................... | H03H 11/20 |
| | | | | 327/237 |
| 2009/0289683 A1* | 11/2009 | Wong | ...................... | H03K 5/06 |
| | | | | 327/232 |
| 2011/0298518 A1* | 12/2011 | Kim | ..................... | H03L 7/0814 |
| | | | | 327/258 |
| 2012/0218001 A1* | 8/2012 | Leibowitz | ................ | H03L 7/08 |
| | | | | 327/9 |
| 2014/0037035 A1* | 2/2014 | Chung | .................. | H03K 5/135 |
| | | | | 375/373 |
| 2015/0070065 A1* | 3/2015 | Dedic | ................... | H03H 17/08 |
| | | | | 327/254 |
| 2016/0036444 A1* | 2/2016 | Li | ................. | H03K 19/017545 |
| | | | | 327/333 |

* cited by examiner

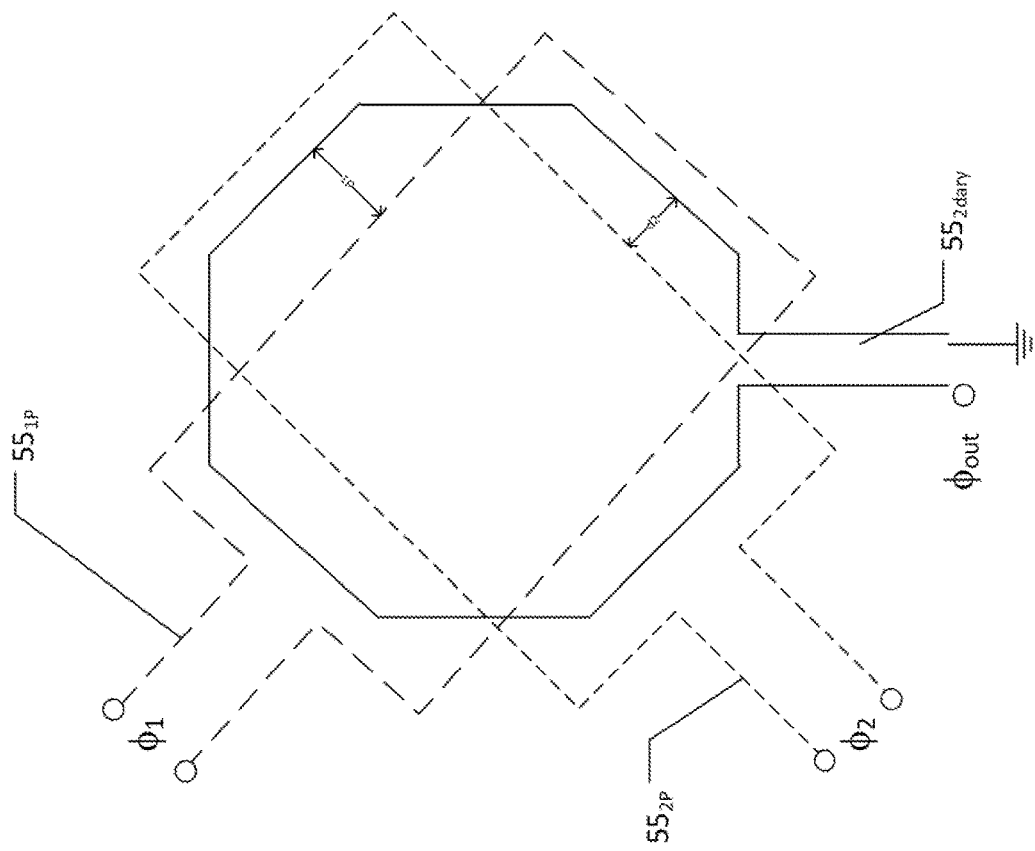

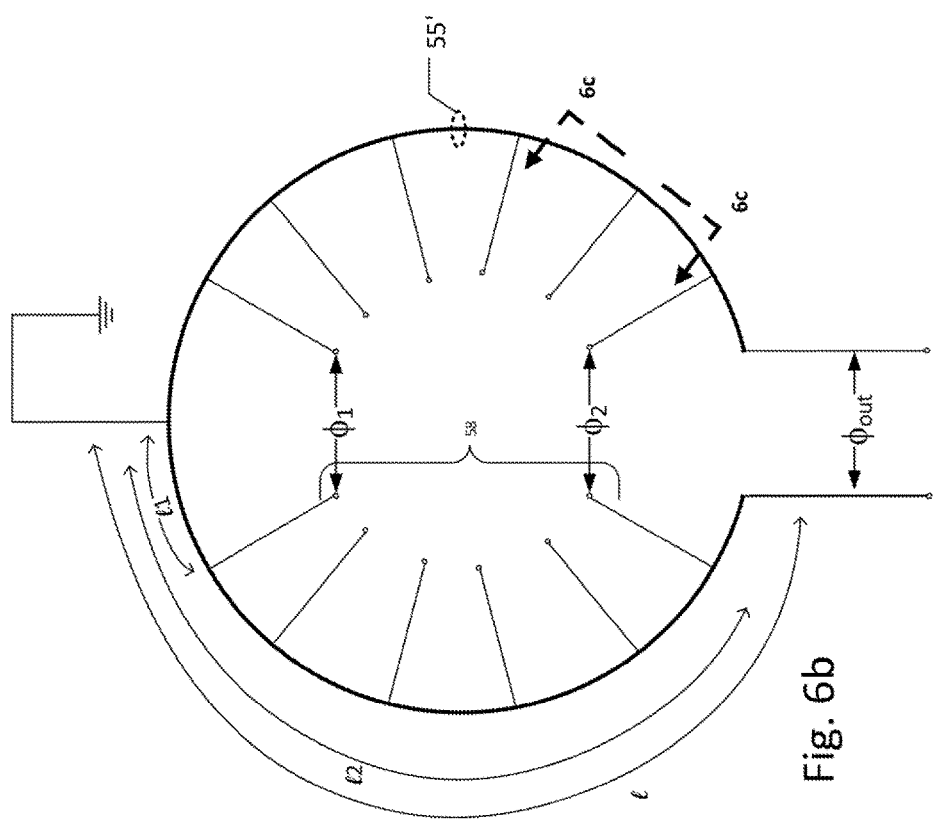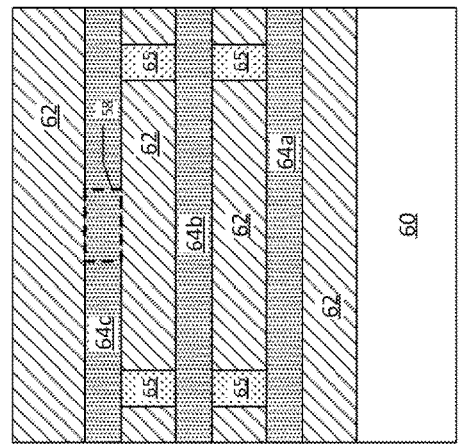

SYSTEM AND METHOD FOR RECONFIGURABLE PHASE SHIFTER AND MIXER

CROSS-REFERENCE TO RELATED APPLICATIONS

This application claims priority, under 35 U.S.C. §119(e), of Provisional Application No. 62/192,796, filed Jul. 15, 2015, incorporated herein by this reference.

STATEMENT REGARDING FEDERALLY SPONSORED RESEARCH OR DEVELOPMENT

Not applicable.

BACKGROUND OF THE INVENTION

This invention is in the field of analog circuits. Embodiments of this invention are more specifically directed to circuits used as phase shifters and frequency mixers.

As well known in the art, the directional transmission and reception of wireless (i.e., radio) signals is commonly implemented by way of multiple antenna systems to which beam forming techniques are applied. In a general sense, beam forming is performed in the transmitting case by controlling the phase and amplitude of signals emitted from the various antennae to create a pattern of constructive and destructive interference in the wavefront of the combined signals. Conversely, the determination of directionality in received radio signals is effected by controlling the phase and amplitude in the combining of the received individual signals. Accordingly, circuits for shifting the phase of an electrical signal are necessary to carry out directional transmission and receipt.

By way of further background, many types of data communications, both wired and wireless, involve the modulation of a carrier signal with a modulating signal at a "baseband" frequency that represents the payload data being communicated. Frequency mixer circuits for accomplishing the "mixing" of the baseband signal and the carrier signal are commonly utilized in these communication systems.

FIG. 1 illustrates, in block diagram form, a generalized conventional architecture for the phase shifting or mixing of periodic signals, which in this example are orthogonal sinusoidal signals. In this simple example, oscillator 2I generates a sinusoidal signal $A\cos(\omega_{RF}t)$ at a given frequency $\omega_{RF}$, and oscillator 2Q generates a sinusoidal signal) $A\cos(\omega_{RF}t+90°)$ at the same frequency and amplitude as, but 90° out of phase from, the signal generated by oscillator 2I. These signals are applied to an input of amplifiers 4I, 4Q, respectively. In the general case, amplifier 4I applies a gain $\alpha(t)$ to the signal $A\cos(\omega_{RF}t)$ from oscillator 2I, and amplifier 4Q applies a gain $\beta(t)$ to the signal $A\cos(\omega_{RF}t+90°)$ from oscillator 2Q. The amplified signals from amplifiers 4I, 4Q are applied to analog adder 5, which produces the output signal Y(t) from the sum of those two signals.

As known in the art, a phase shifter will be realized by the architecture of FIG. 1 for the case in which amplifiers 4I, 4Q apply constant (i.e., non-time-varying, or DC) gains $\alpha$, $\beta$, respectively, to the orthogonal sinusoidal signals, where:

$\forall(\alpha,\beta)\leq 1$; and $\alpha^2+\beta^2=1$

In other words, points representing the pair of gains $\alpha$, $\beta$ will all lie on the unit circle. One can thus derive the output signal Y(t) as:

$Y(t)=\alpha A\cos(\omega_{RF}t)+\beta A\cos(\omega_{RF}t+90°)$ and thus as:

$Y(t)=A\cos(\omega_{RF}t+\phi)$ where:

$\phi = \tan^{-1}\left(\frac{\beta}{\alpha}\right)$

Accordingly, the architecture of FIG. 1 generates a phase shift in the input sinusoid $A\cos(\omega_{RF}t)$ by an angle $\phi$ corresponding to the ratio of the two constant gain values.

Also as known in the art, a frequency mixer will be realized by the architecture of FIG. 1 by the application of sinusoidal gain functions $\alpha(t)$, $\beta(t)$ by amplifiers 4I, 4Q that are at the same frequency as one another, but differing from the frequency $\omega_{RF}$ from oscillators 2I, 2Q, and in an orthogonal relationship with one another. More specifically, for gain functions $\alpha(t)$, $\beta(t)$:

$\alpha(t)=\alpha_0\cos(\omega_{BB}t)$ $\beta(t)=\beta_0\cos(\omega_{BB}t+90°)$ where:

$\forall(\alpha_0,\beta_0)\leq 1$; and $\alpha_0^2+\beta_0^2=1$ (i.e., on the unit circle), one can derive the output signal Y(t) as:

$Y(t)=\alpha_0 A\cos(\omega_{BB}t)\cos(\omega_{RF}t)+\beta_0 A\cos(\omega_{BB}t+90°)\cos(\omega_{RF}t+90°)$ and thus as:

$Y(t)=A\cos((\omega_{RF}+\omega_{BB})t+\phi)$ where:

$\phi = \tan^{-1}\left(\frac{\beta_0}{\alpha_0}\right)$

As suggested by the above example, the frequencies at which phase shifters and mixers are required to operate can be quite high, well into the radio frequency (RF) bands. At these frequencies, conventional high frequency phase shifters tend to use passive components, such as quadrature hybrids, or are based on lumped elements in effecting these functions. These implementations necessarily come with significant limitations, including time-varying and unbalanced loads presented by the circuits to the high frequency oscillators, the generation and effect of noise in the transmission paths, non-linearities, and other departures from ideal performance, as well as tending to consume significant power during operation. In addition, passive components suitable for high frequency use are not necessarily well-suited for integration into single-chip solutions, and add significant cost and size to the eventual end system.

BRIEF SUMMARY OF THE INVENTION

Disclosed embodiments provide an analog phase shifter or frequency mixer circuit that can be realized by active devices.

Disclosed embodiments provide such a circuit that presents extremely high input impedance to oscillators and other input circuits, thus attaining a high Q factor without requiring capacitive or inductive coupling.

Disclosed embodiments provide such a circuit that present a constant and balanced load to oscillators and other input circuits.

Disclosed embodiments provide such a circuit that can operate with high linearity while supporting a high dynamic range.

Disclosed embodiments provide such a circuit that can be operated at high precision and resolution under the control of conventional digital-to-analog converters (DACs), in combination with the ability to compensate for variations in process parameters.

Disclosed embodiments provide such a circuit that provides excellent noise suppression during operation.

Disclosed embodiments provide such a circuit that can be configured for use as a phase shifter or as a frequency mixer, allowing use of the same hardware for multiple applications.

Other objects and advantages of the disclosed embodiments will be apparent to those of ordinary skill in the art having reference to the following specification together with its drawings.

According to disclosed embodiments, an analog circuit is constructed that receives first and second periodic differential signals at a selected frequency and a selected phase relative to one another. One or more phase interpolators are provided, each phase interpolator including a load, a plurality of transistor pairs, and a tail transistor associated with each transistor pair. The first periodic differential signal are applied across gates of tail transistors, and a first differential gain signal is applied across gates of the transistors in a pair associated with each of the tail transistors. The second periodic differential signal and second differential gain signal is similarly applied. The differential gain signals may be DC levels, or a periodic baseband signals with the first and second gain signals at a phase angle relative to one another. The output signal is developed at a load, such as an inductor or a transformer load, that is coupled to the transistor pairs.

BRIEF DESCRIPTION OF THE SEVERAL VIEWS OF THE DRAWING

FIG. 6a is a plan view of a transformer-based load for use in the circuit of FIG. 5 according to an embodiment.

FIG. 6b is a plan view of a transformer-based load for use in the circuit of FIG. 5 according to another embodiment.

FIG. 6c is a cross-sectional view of a portion of the transformer-based load in the embodiment of FIG. 6b.

DETAILED DESCRIPTION OF THE INVENTION

The one or more embodiments described in this specification are implemented into a reconfigurable phase shifter and frequency mixer circuit, using metal-oxide-semiconductor (MOS) technology and operating on differential signals, as it is contemplated that such implementation is particularly advantageous in that context. However, it is also contemplated that concepts of this invention may be beneficially applied in other applications, including circuits realized using bipolar junction transistor (BJT) technology. Accordingly, it is to be understood that the following description is provided by way of example only, and is not intended to limit the true scope of this invention as claimed.

Figure 1:
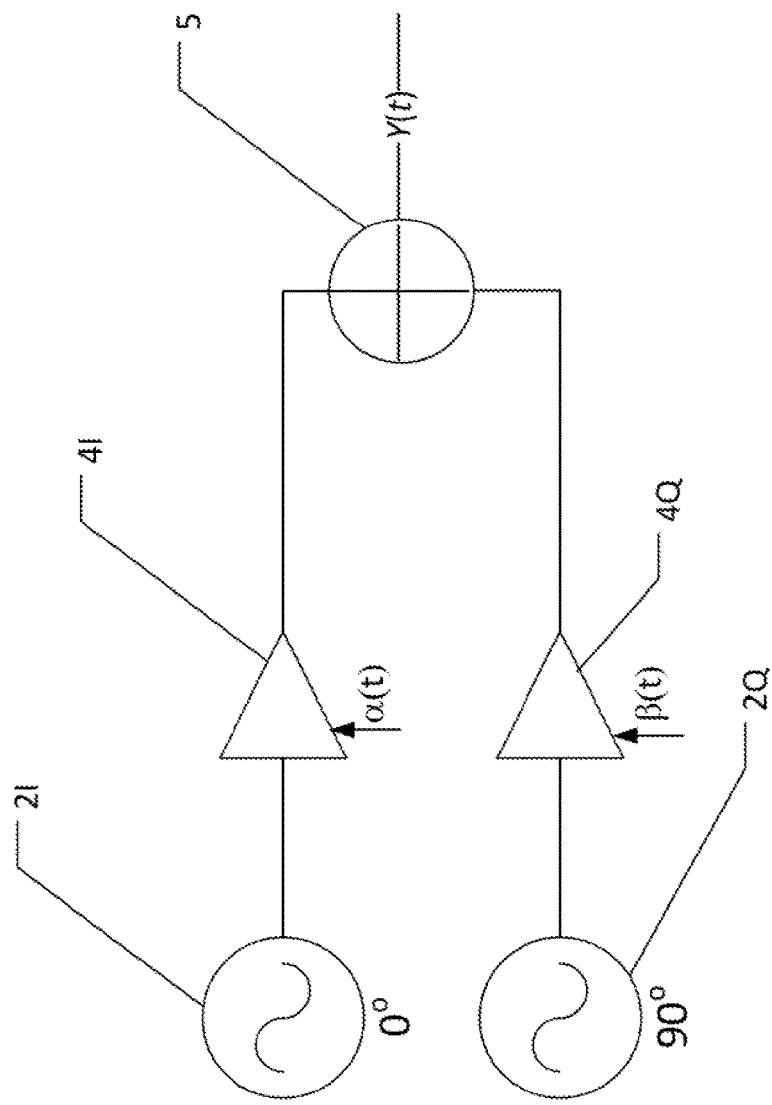
FIG. 1 is an electrical diagram, in schematic form, of a conventional phase shifter or frequency mixer function.
Figure 2A:
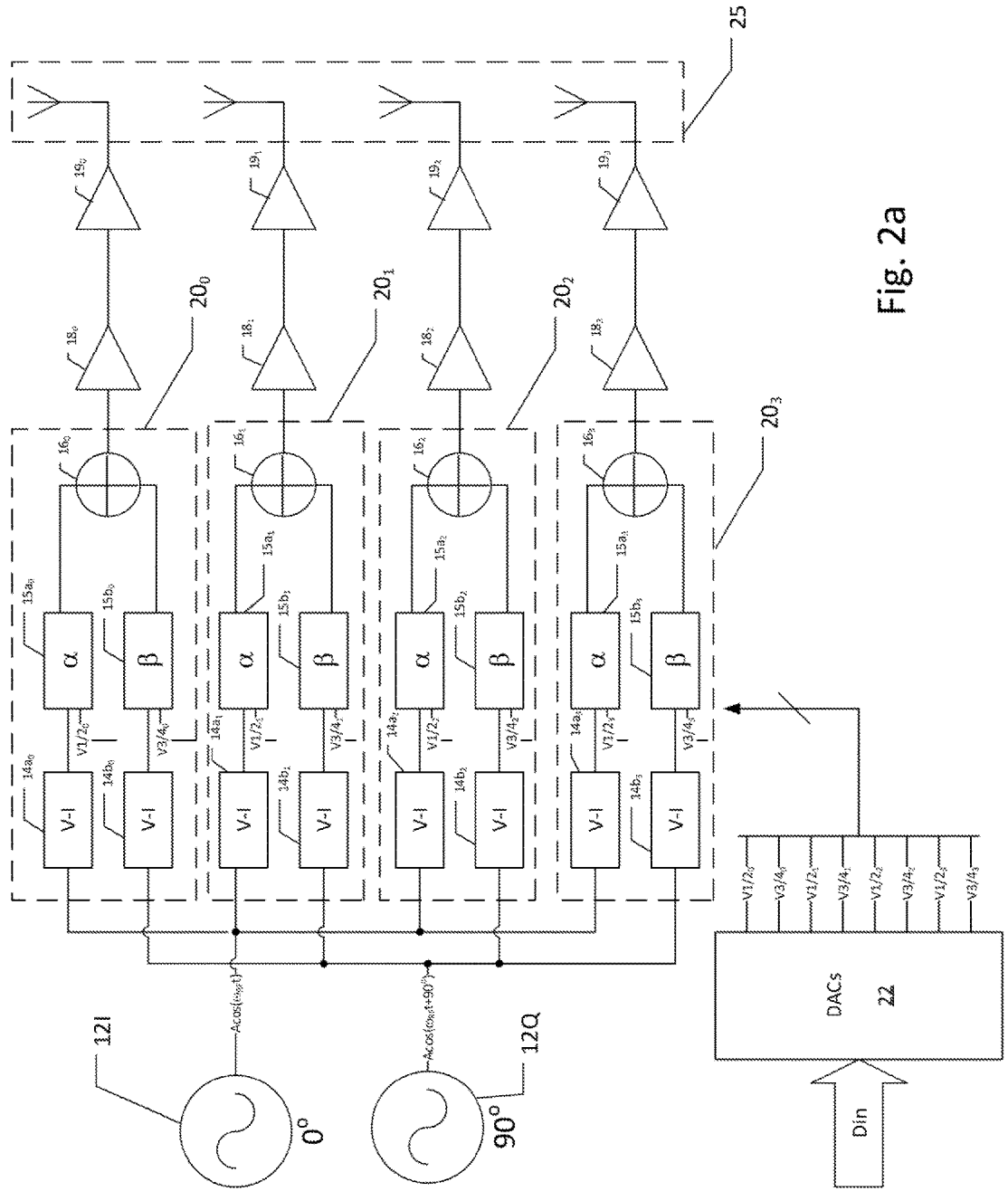
FIG. 2a is an electrical diagram, in block form, of an architecture for a multi-channel transmitter including phase shifters constructed according to disclosed embodiments.

FIG. 2a is a block diagram of an architecture for a transmitter in a multiple antenna system, for example in a multi-antenna RADAR system in which beamforming techniques are used to directionally transmit radio frequency signals, and into which embodiments disclosed in this specification may be implemented. As well known in the art, the term beamforming refers to the directional transmission of electromagnetic energy through the use of constructive and destructive interference among the signals generated from multiple antenna in an array. More specifically, beamforming involves the control of the phase angle of signals transmitted from each antenna in the antenna array relative to adjacent antennae, such that the resultant waveform emanates from the antenna array in the desired direction. Similar beamforming techniques can be applied by a receiver function, to determine the direction from which the received signals are transmitted.

In order to control the phase of signals transmitted from a given antenna in an array, phase shifter circuits are inserted into the signal path of the transmitter. The transmitter architecture shown in FIG. 2a includes four transmitter channels, each channel including a corresponding phase interpolator $20_0$, $20_1$, $20_2$, $20_3$ constructed according to an embodiment described in further detail below. Differential voltage controlled oscillators (VCOs) 12I, 12Q each produce differential periodic signals at the same RF frequency, but at a 90° phase angle relative from one another, as typical in the art. In this example, the differential signal A $\cos(\omega_{RF}t)$ generated by VCO 12I will be considered as the "in-phase" component at frequency $\omega_{RF}$, at a nominal phase of 0°, while the differential signal periodic signal A $\cos(\omega_{RF}t+90°)$ generated by VCO 12Q will be considered as the "quadrature-phase" component at that same frequency and at a phase of 90° from signal A $\cos(\omega_{RF}t)$ generated by VCO 12I.

In this embodiment, each phase interpolator $20_x$ receives the differential periodic signals from VCO 12I, 12Q. Referring to phase interpolator $20_0$ by way of example, voltage-current converter $14a_0$ receives the in-phase differential periodic signal from VCO 12I, and presents a corresponding current signal to gain stage $15a_0$, which applies a gain $\alpha_0$ set by voltages $V1_0$, $V2_0$ to that current signal. Similarly, voltage-current converter $14b_0$ receives the quadrature-phase differential periodic signal from VCO 12Q, and presents a corresponding current signal to gain stage $15b_0$, which applies a gain $\beta_0$ that is set by voltages $V3_0$, $V4_0$. The outputs of gain stages $15a_0$, $15b_0$ are added by sum function $16_0$, and that summed signal is amplified by power amplifier stages $18_0$, $19_0$ and transmitted by a corresponding one of the antennae of array 25. In this phase shifter implementation, voltages $V1_0$, $V2_0$, $V3_0$, $V4_0$ are DC voltages generated by digital-to-analog converters (DACs) 22 in response to digital input data Din, such as may be generated by a processor or other logic circuitry (not shown). DACs 22 are contemplated to be constructed in the conventional manner, as well known in the art.

As described above, if the gains $\alpha_0$, $\beta_0$ of gain stages $15a_0$, $15b_0$, respectively, are considered as time-invariant and have the following relationship:

$$V(\alpha_0, \beta_0) \le 1; \text{ and}$$

$$\alpha_0^2 + \beta_0^2 = 1$$

sum function $16_0$ produces an output signal $Y_0(t)$:

$$Y_0(t) = \alpha_0 A \cos(\omega_{RF} t) + \beta_0 A \cos(\omega_{RF} t + 90) = A \cos(\omega_{RF} t + \phi_0)$$

where:

$$\phi_0 = \tan^{-1}\left(\frac{\beta_0}{\alpha_0}\right)$$

The three other channels based on phase interpolators $20_1$, $20_2$, $20_3$ in the architecture of FIG. 2a similarly generate output signals $Y_1(t)$, $Y_2(t)$, $Y_3(t)$, respectively, with the relationship among the phase angles $\phi_0$, $\phi_1$, $\phi_2$, $\phi_3$ of the four channels determining the directionality of the wavefront transmitted from antenna array 25.

As noted above, DACs 22 generate the voltages $V1_x$, $V2_x$, $V3_x$, $V4_x$ for all of the channels of this transmitter, in response to which gain stages $15a_x$, $15b_x$ apply the corresponding gains $\alpha_x$, $\beta_x$, respectively, and thus which set the phase angles $\phi_0$, $\phi_1$, $\phi_2$, $\phi_3$ of the four channels of the transmitter. More specifically, as will be described in further detail below in connection with this embodiment, gain stage $15a_x$ in a given channel applies its gain $\alpha_x$, $\beta_x$ in response to a differential between voltages $V1_x$ and $V2_x$, and gain stage $15b_x$ in that channel applies its gain $\beta_x$ in response to a differential between voltages $V3_x$ and $V4_x$.

Figure 3:
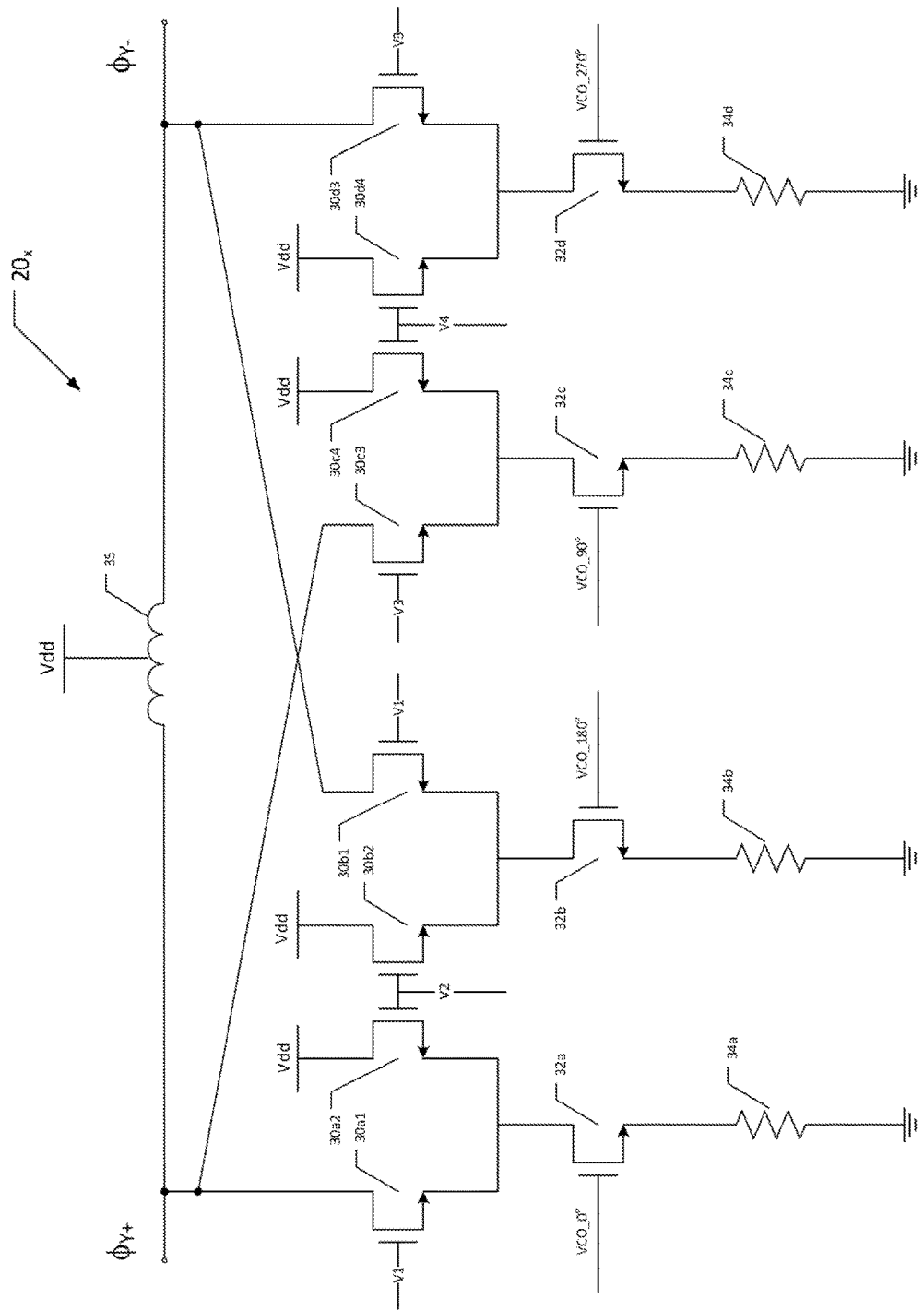
FIG. 3 is an electrical diagram, in schematic form, of a configurable circuit operable as a phase shifter or as a frequency mixer according to an embodiment.

Referring now to FIG. 3, the construction of phase interpolator $20_x$ according to an embodiment will now be described in detail. It is contemplated that each of the phase interpolators 20 in the multiple antenna transmitter architecture of FIG. 2a according to this embodiment would be similarly constructed, to facilitate matching and optimize control of the directionality of the transmitted signal. As described above, phase interpolator $20_x$ receives differential periodic signals from each of VCOs 12I and 12Q, and generates a differential output signal $Y_x(t)$, at terminals $\phi_{Y+}$, $\phi_{Y-}$ shown in FIG. 3. Terminals $\phi_{Y+}$, $\phi_{Y-}$ are coupled to a load, which in this case is an inductive load presented by inductor 35, which is DC biased to the Vdd power supply.

Phase interpolator $20_x$ in this embodiment is constructed as a pair of transistor "quads", each of which includes two pair of n-channel metal-oxide-semiconductor (MOS) transistors in this example; it is contemplated that phase interpolator $20_x$ may alternatively be constructed using bipolar transistors, if desired. One of these pairs in a first quad of phase interpolator $20_x$ includes transistors 30a1, 30a2, which have their source nodes connected together at the drain of tail transistor 32a. The drain of transistor 30a1 is coupled to terminal $\phi_{Y+}$ and the drain of transistor 30a2 is biased to the Vdd power supply. A differential gain signal that sets the gain $\alpha$ (e.g., $\alpha \propto (V1-V2)$, centered around a midpoint) is applied across the gates of paired transistors 30a1, 30a2, by way of voltages V1, V2 from corresponding DACs 22 applied at the gates of transistor 30a1, 30a2, respectively. Similarly, transistors 30b1, 30b2 in the other pair of this first quad have their source nodes connected together at the drain of tail transistor 32b, and their gates receiving the differential gain signal by way of voltage V2 applied to the gate of transistor 30b2, and voltage V1 applied to the gate of transistor 30b1. The drain of transistor 30b1 is coupled to terminal $\phi_{Y-}$, and the drain of transistor 30b2 is coupled to the Vdd power supply. Tail transistors 32a, 32b have their sources coupled to ground via resistors 34a, 34b, respectively, and their gates receiving the differential periodic signal from VCO 12I. In this implementation, the gates of tail transistors 32a, 32b receive the periodic signal from VCO 12I at phases of 0° and 180°, respectively.

The other quad of transistors of phase interpolator $20_x$ is similarly constructed. More specifically, transistors 30c3, 30c4 have their source nodes connected together at the drain of tail transistor 32c, and transistors 30d3, 30d4 have their source nodes connected together at the drain of tail transistor 32d. The drain of transistor 30c3 is coupled to terminal $\phi_{Y+}$ and the drain of transistor 30c4 is biased to the Vdd power supply, while the drain of transistor 30d3 is coupled to terminal $\phi_{Y-}$ and the drain of transistor 30d4 is biased to the Vdd power supply. A differential gain signal that sets the gain $\beta$ (e.g., $b \propto (V3-V4)$, centered around a midpoint) is applied across the gates of paired transistors 30c3, 30c4, and 30d3, d4, by way of voltage V3 from corresponding DACs 22 at the gates of transistor 30c3 and 30d3, and voltage V4 from corresponding DACs 22 at the gates of transistor 30c4 and 30d4. Tail transistors 32c, 32d have their sources coupled to ground via resistors 34c, 34d, respectively, and their gates receiving the differential periodic signal from VCO 12Q, at phases of 90° and 270°, respectively.

In operation, referring to transistors 30a1, 30a2 and tail transistor 32a by example, the periodic signal VCO_0° controls the current conducted by tail transistor 32a, and thus the sum of the currents conducted by transistors 30a1, 30a2. The differential voltage between voltages V1, V2 from DACs 22 thus controls the differential currents conducted by transistors 30a1, 30a2, and thus the amplitude of the in-phase pull-down current at current terminal $\phi_{Y+}$ that follows the 0° phase periodic signal from VCO 12I. Similarly, the periodic signal VCO_180° controls the current conducted by tail transistor 32b, and thus the sum of the currents conducted by transistors 30b1, 30b2, while the differential voltage between voltages V1, V2 controls the differential currents conducted by transistors 30b1, 30b2, and thus the amplitude of the in-phase pull-down current at terminal $\phi_{Y-}$ following the 180° phase periodic signal from VCO 12I. In this manner, the differential between voltages V1 and V2 establishes the gain $\alpha$ at which the in-phase differential periodic signal from VCO 12I appears as a differential current across terminals $\phi_{Y+}$ and $\phi_{Y-}$. Referring to the architecture of FIG. 2a, this "quad" of transistors 30a1, 30a2, 30b1, 30b2, along with associated tail transistors 32a, 32b, implement voltage-to-current conversion function $14a_x$ and gain stage $15a_x$ in phase interpolator $20_x$.

The other "quad" of transistors 30c3, 30c4, 30d3, 30d4, and associated tail transistors 32c, 32d, operate in a similar fashion, to control the quadrature-phase pull-down current at terminals $\phi_{Y+}$ and $\phi_{Y-}$ in response to the differential voltage between voltages V3 and V4, and thus the differential between voltages V3 and V4 establishes the gain $\beta$ at which the quadrature-phase differential periodic signal from VCO 12Q appears as a differential current across terminals $\phi_{Y+}$ and $\phi_{Y-}$. In this arrangement, the connection of the drains of transistors 30a1 and 30c3 at terminal $\phi_{Y+}$ operates to sum the two pull-down currents controlled by those transistors at that node. Similarly, the connection of the drains of transistors 30b1 and 30d3 at terminal $\phi_{Y-}$ operates to sum the two pull-down currents controlled by those transistors at that node. Accordingly, the differential current appearing at terminals $\phi_{Y+}$ and $\phi_{Y-}$ is the sum of the differential in-phase and quadrature-phase currents at the respective gains α and β, implementing sum function $16_x$ of phase interpolator $20_x$ in the architecture of FIG. 2a.

Figure 4A:
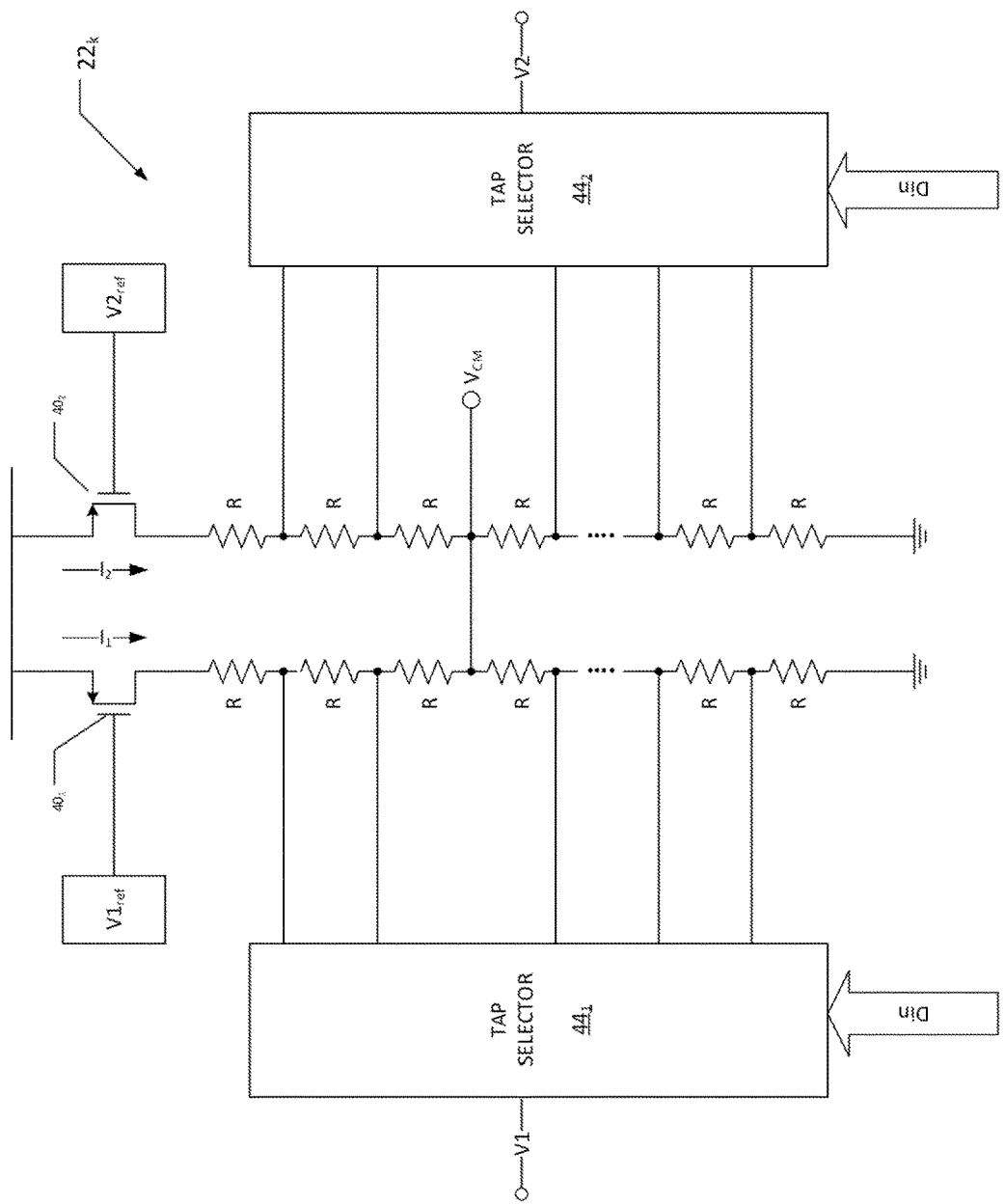
FIG. 4a is an electrical diagram, in schematic form, of a digital-to-analog converter (DAC) in the circuit of FIG. 3 according to an embodiment.

According to these embodiments, the construction of phase interpolator $20_x$ so that gains α, β are set by differential voltages V1–V2 and V3–V4 allows DACs 22 to be operated in an optimal portion of their operating characteristic, from the standpoint of linearity and precision. FIG. 4a illustrates the representative construction of an instance 22k of DACs 22, for generating voltages V1, V2 according to this embodiment; it will of course be understood that DACs 22 that generate voltages V3, V4 are similarly constructed. In this embodiment, DAC $22_k$ is constructed to have first and second legs that precisely generate accurate voltages V1, V2, respectively. One leg includes p-channel MOS transistor $40_1$ with its source at the Vdd power supply and its gate receiving a reference voltage from voltage generator V1$_{ref}$; a number of identical resistors R are connected in series between the drain of transistor $40_1$ and ground. Similarly, the other leg includes p-channel MOS transistor $40_2$ with its source at the Vdd power supply and its gate receiving a reference voltage from voltage generator V2$_{ref}$; another set of identical resistors R are connected in series between the drain of transistor $40_2$ and ground. Tap points are defined at the nodes between resistors R in each leg. Tap selector circuits $40_1$, $40_2$ select the desired one of these tap points for forwarding as voltages V1, V2, respectively, in response to a digital input Din, thus effecting a digital to analog conversion.

Figure 4B:
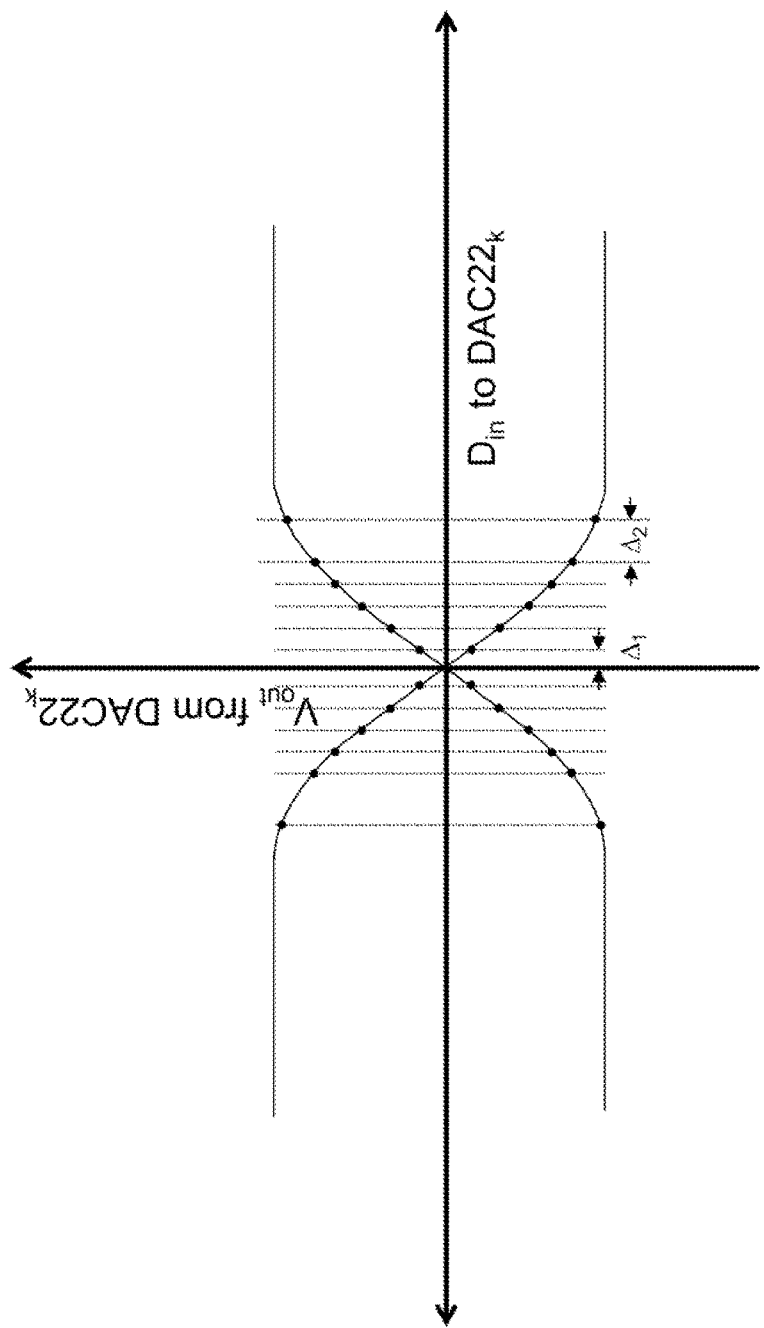
FIG. 4b is a plot of a digital-to-analog converter (DAC) transfer function illustrating a quasi-linear operating range over which the transmitter architectures of FIGS. 2a and 2b may be operated.

Corresponding tap points in the interior of each of the two legs are connected together and receive a common mode voltage $V_{CM}$. The particular value of $V_{CM}$ is selected in a manner specific to the particular design, and is a "common mode" reference point for the gain switching quad used to implement the α and β values; specifically, since both legs receive common mode voltage $V_{CM}$, the current will effectively split equally between the two. FIG. 4b illustrates a plot of the transfer characteristic of DAC $22_k$ in the architecture of FIG. 2a, where the horizontal axis corresponds to the value of the digital data Din input to DAC $22_k$ corresponding to the input voltage and the vertical axis corresponds to the analog output voltage Vout (V1 or V2, as the case may be) from DAC $22_k$ in response. The common mode voltage $V_{CM}$ sets the origin (i.e., crossing point) of the plots of FIG. 4b. To obtain a voltage higher than $V_{CM}$, a tap point is selected that is higher than the common mode point in the resistor string, and a lower voltage is obtained by selecting a tap point lower than the common mode point. One may encode tap selectors $44_1$, $44_2$ to vary in opposite directions with the Din value, as suggested by FIG. 4b, if desired. As evident from FIG. 4b, the overall transfer characteristic of DAC $22_k$ is generally linear in the region near the origin set by the common mode voltage $V_{CM}$, near the center of its operating characteristic, but begins to deviate from that linearity at its extremes, as indicated by the voltage differential Δ2 near the knee of the curve being larger than the first differential Δ1 from the origin.

In the phase shifter configuration of FIG. 2a, voltage generators V1$_{ref}$, V2$_{ref}$ apply stable reference voltages to the gates of transistors $40_1$, $40_2$, respectively, so that currents I1 and I2 are fixed DC quantities. The n units of resistance R then define the resolution of DAC $22_k$. For example, if R=10Ω, and I1=0.1 mA, the resolution of voltage V1 will be about 1 mV.

According to this embodiment, the overall accuracy and linearity at which voltages V1, V2, V3, V4 can be generated, and thus at which the gains α, β are established, can be optimized. In addition, by operating DAC $22_k$ in this limited generally limited range, the phase angle of each signal can be generated with a very high resolution, as compared with conventional phase shifters and similar circuits. In a transmitter application such as shown in the example of FIG. 2a, the phase relationship among the signals from the multiple antennae can thus be precisely and accurately controlled, at a high resolution, which results in excellent directional control of the wavefront.

In the transmitter architecture described above relative to FIG. 2a, DACs 22 generate DC voltages V1, V2, V3, V4 that determine the gains α, β and thus phase interpolators 20 are operating as phase shifters. However, circuit and system implementations of these embodiments can readily be reconfigured for use in a data communication or other modulated signal application, specifically by operating phase interpolator $20_x$ of FIG. 3 as a frequency mixer. In this configuration, voltages V1(t), V2(t), V3(t), V4(t) each constitute a periodic signal at a selected frequency, such as the baseband frequency at which the modulating signal is to be communicated; in this mixer arrangement, voltages V3(t) and V4(t) are at a phase angle of 90° relative to voltages V1(t) and V2(t). For the example in which the baseband waveform is a sinusoid $\cos(\omega_{BB}t)$, the differential voltage between voltages V1(t) and V2(t) establish an AC gain signal α $\cos(\omega_{BB}t)$, and the differential voltage between voltages V3(t) and V4(t) establish an AC gain signal β $\cos(\omega_{BB}t+90°)$. As before, the gain magnitudes α, β have the relationship:

$$\forall(\alpha,\beta)\leq 1; \text{ and}$$

$$\alpha^2+\beta^2=1$$

to produce an output signal Y(t):

$$Y(t)=\alpha A\cos(\omega_{BB}t)\cos(\omega_{RF}t)+\beta A\cos(\omega_{BB}t+90°)\cos(\omega_{RF}t+90°)=A\cos((\omega_{RF}+\omega_{BB})t+\phi)$$

where:

$$\phi = \tan^{-1}\left(\frac{\beta}{\alpha}\right)$$

Figure 2B:
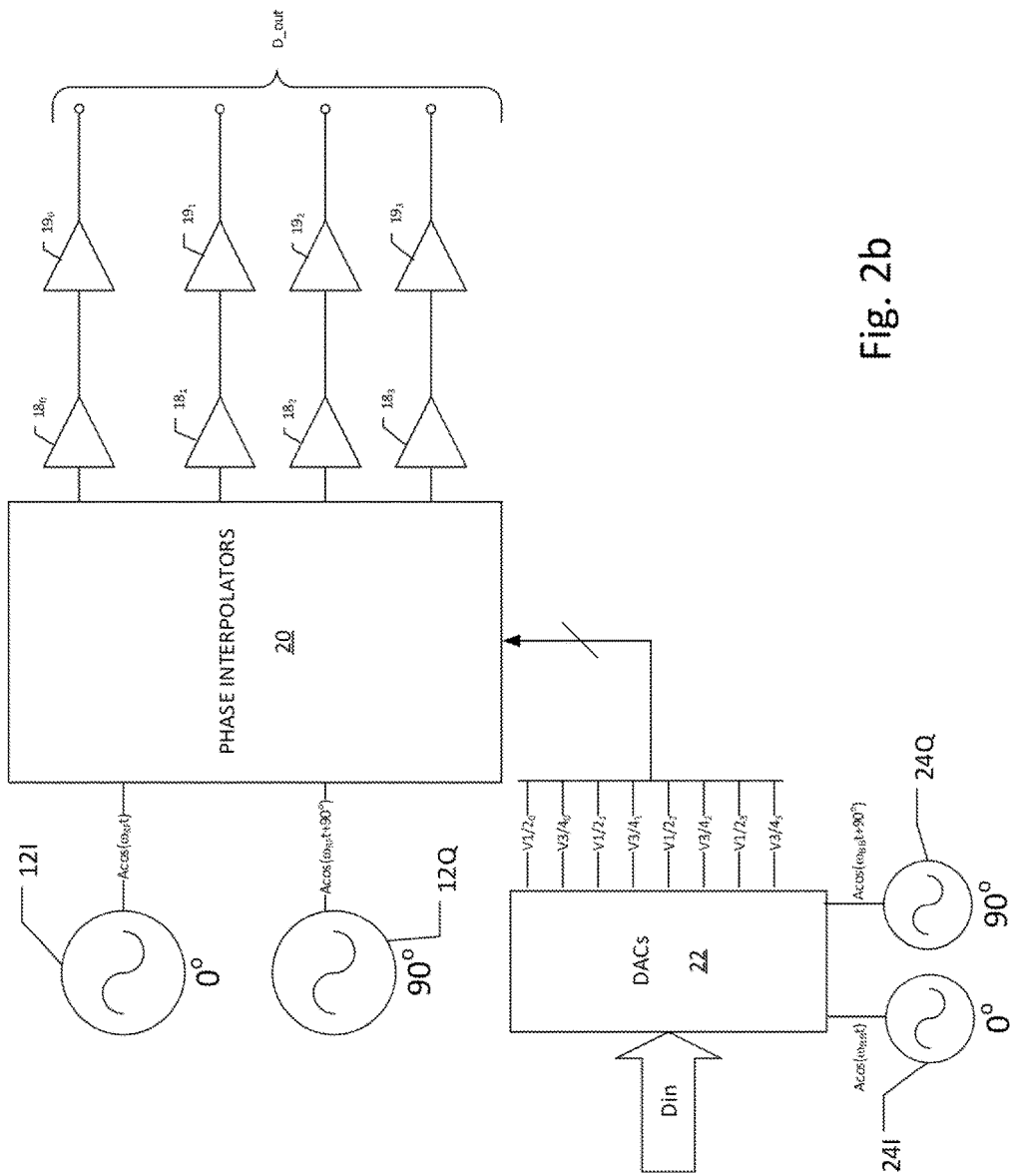
FIG. 2b is an electrical diagram, in block form, of an architecture for a multi-channel transmitter including frequency mixers constructed according to disclosed embodiments.

FIG. 2b illustrates an example of an architecture for this implementation in which phase interpolators $20_x$ are operated as frequency mixers, such as may be used in a beamforming application, rather than as phase shifters. This architecture is similar to that of the multiple antenna transmitter architecture of FIG. 2a, but with the addition of baseband signals from oscillators 24I, 24Q that are applied to DACs 22. In this arrangement, baseband oscillator 24I generates in-phase periodic signal A $\cos(\omega_{BB}t)$ at baseband frequency $\omega_{BB}$, and baseband oscillator 24Q generates quadrature-phase periodic signal A $\cos(\omega_{BB}t+90°)$ at that same frequency. Referring to the embodiment shown in FIG. 4a, the periodic signals generated by baseband oscillators 24I, 24Q are applied to voltage generators V1$_{ref}$, V2$_{ref}$, specifically with the in-phase signal A $\cos(\omega_{BB}t)$ applied to those DACs 22 generating voltages V1 and V2, and the quadrature-phase signal) A cos($\omega_{BB}$t+90°) applied to those DACs generating voltages V3, V4. In this mixer configuration, voltage generators V1$_{ref}$, V2$_{ref}$ control respective transistors 40$_1$, 40$_2$ to conduct phasor currents I1 and I2 at the baseband frequency, but at opposite phases from one another (i.e., one at a phase of 0° and the other at 180°). In this configuration, relying on full symmetry and linear superposition, common mode voltage V$_{CM}$ is again held at the desired common mode DC level. Voltages V1 and V2 can again be chosen by tap selectors 44$_1$, 44$_2$ (typically constructed as transmission gates) selecting the desired tap points to implement the desired α and β values in the same manner as the DC situation described above, but as AC signals at the baseband frequency. Hence, in both cases (DC and AC), the common mode voltage V$_{CM}$ is held at a DC point, and the trigonometric weights reflected by the α and β values are implemented using the tapping points. As a result, DACs 22 will generate voltages V1$_x$(t), V2$_x$(t), V3$_x$(t), V4$_x$(t) at the baseband frequency $\omega_{BB}$t, and at the 0° and 90° phases for application to phase interpolators 20$_x$, which produce the mixed signals Y$_x$(t) at the output of each channel. Power amplifier stages 18$_x$, 19$_x$ each produce the resulting modulated signals at terminals D_out to communicate the input data received by DACs 22 at digital input Din.

As such, according to this embodiment, reconfiguration of phase interpolators 20$_x$ as frequency mixers rather than phase shifters, rather than vice versa, requires no changes to the circuits of phase interpolators 20$_x$ themselves; rather, the architecture of the particular implementation into which phase interpolators 20$_x$ accomplish this reconfiguration. Circuit design and flexibility is significantly improved as a result. This mixer configuration may be either single balanced or double balanced; in the double-balanced case, the upper switching quad receives the lower frequency (e.g., the baseband frequency) input.

The construction of phase interpolators 20$_x$, and the configurable operation of phase interpolators 20$_x$ as phase shifters or frequency mixers, according to these embodiments, provides important advantages and benefits as compared with conventional circuits for these functions. In particular, referring to FIG. 3, the outputs of VCOs 12I, 12Q are driven at a high Q factor because of the high input impedance presented by the gates of tail transistors 32a through 34a, and the resulting DC coupled amplitude from VCOs 12I, 12Q to phase interpolators 20$_x$ greatly reduces the power loss at the interface between phase interpolators 20$_x$ and VCOs 12I, 12Q and leads to utilization of the maximum conductor width of the metallization stack. In addition, the load presented by phase interpolators 20$_x$ to VCOs 12I, 12Q is constant, and consistent among the multiple legs within, as well as among, phase interpolators 20$_x$. This construction also provides good reverse isolation from downstream power amplifier stages (e.g., power amplifiers 18$_x$, 19$_x$ of FIGS. 2a and 2b) toward VCOs 12I, 12Q.

Furthermore, the resistor-based pseudo-differential input stages of the transistor quads of phase interpolators 20$_x$ are quite linear in operation, and capable of supporting a high amplitude swing, while allowing DACs 22 to operate in their generally linear dynamic ranges, resulting in accurate, precise, and high-resolution phase shifting and frequency mixing performance. In addition, the cascode arrangement of the legs of phase interpolators 20$_x$ suppresses noise from DACs 22 from appearing in the output signal Y(t). Process compensation and calibration of phase interpolators 20$_x$ is readily attainable and automatically applied, specifically by adjusting the DAC code as appropriate. And because this compensation, and indeed the phase shifting itself, is implemented at DC, the output phase angle can be accurately and precisely controlled. High frequency operation is also achievable from these embodiments, as transistors 30, 32 of phase interpolators 20$_x$ may be realized by near minimum length devices.

Figure 5:
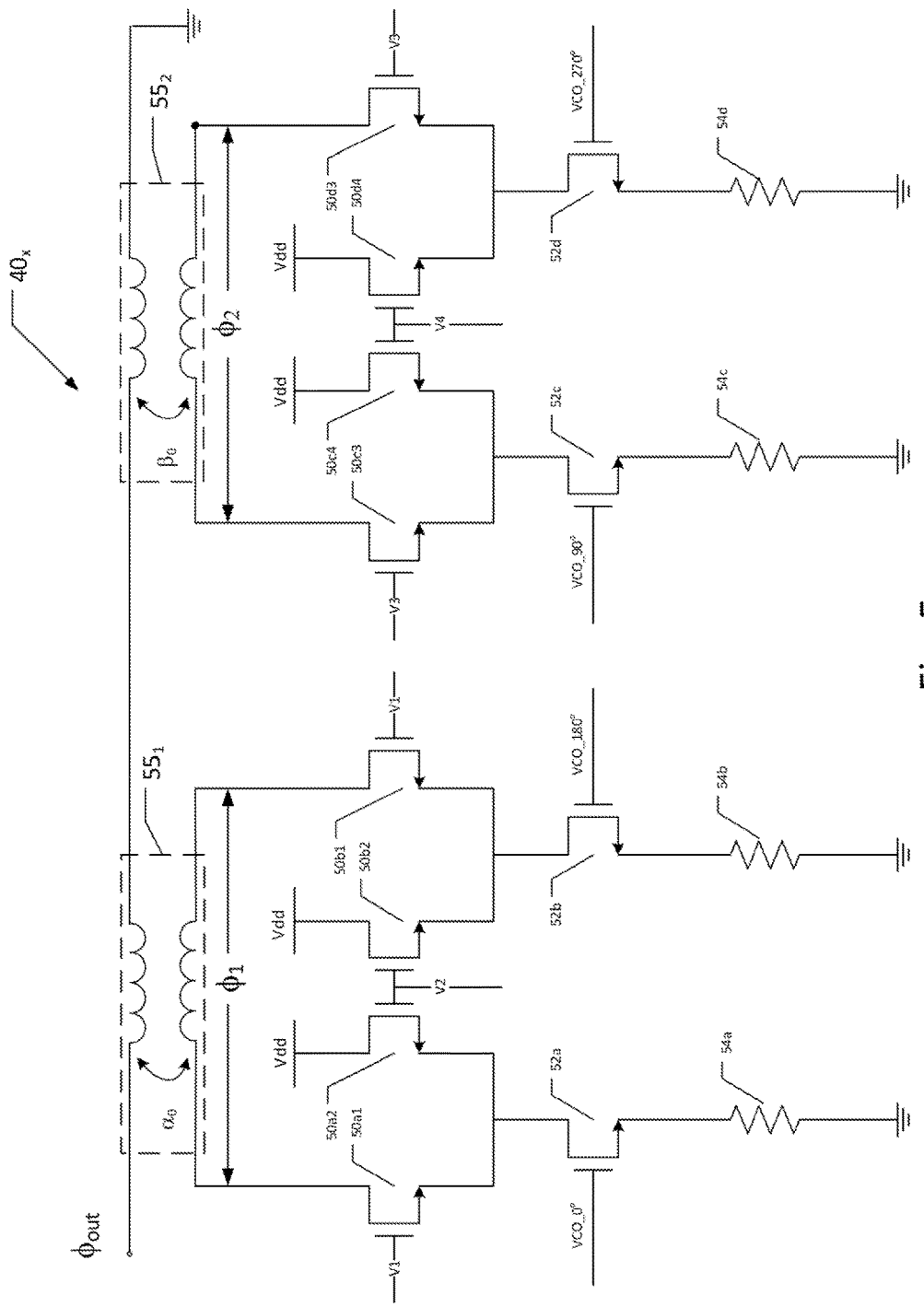
FIG. 5 is an electrical diagram, in schematic form, of a configurable circuit operable as a phase shifter or as a frequency mixer according to another embodiment.

According to another embodiment, a phase interpolator is provided in which the gains α, β may be implemented in part by the output voltages from DACs, to perform signal scaling in the electrical domain, and in part by the magnetic couplings associated with the load. FIG. 5 illustrates an implementation of phase interpolator 40$_x$ according to this embodiment.

In this implementation, similarly as described above, phase interpolator 40$_x$ is constructed as a pair of transistor "quads", each of which includes two pair of n-channel MOS transistors. In one pair of a first quad of phase interpolator 20$_x$, transistors 50a1, 50a2 have their source nodes connected together at the drain of tail transistor 52a, and their gates receiving voltages V1, V2, respectively. Similarly, transistors 50b1, 50b2 of the other pair of this quad have their source nodes connected together at the drain of tail transistor 52b, and their gates receiving the differential gain signal by way of voltages V1, V2, respectively. Tail transistors 52a, 52b have their sources coupled to ground via resistors 54a, 54b, respectively, and their gates receiving the 0° phase signal VCO_0° and the 180° phase signal VCO_180°, respectively, from VCO 12I. The drains of transistors 50a2, 50a3 are biased to the Vdd power supply.

The other quad in phase interpolator 40$_x$ is similarly constructed. Transistors 50c3, 50c4 have their source nodes connected together at the drain of tail transistor 52c, and transistors 50d3, 50d4 have their source nodes connected together at the drain of tail transistor 52d. The drains of transistors 50c4 and 50d4 are biased to the Vdd power supply. Voltage V3 is applied at the gates of transistors 50c3, 50d3, and voltage V4 is applied at the gates of transistors 50c4 and 50d4. Tail transistors 52c, 52d have their sources coupled to ground via resistors 54c, 54d, respectively, and their gates receiving the differential periodic signal from VCO 12Q, at phases of 90° and 270°, respectively.

The load seen by the two quads of phase interpolator 40$_x$ is constituted by transformers 55$_1$, 55$_2$, and as such, the coupling of the quads to this load differs from that described above in connection with phase interpolator 20$_x$. In this embodiment, the drains of transistors 50a1 and 50a3 are connected to opposing sides of the primary of transformer 55$_1$, with the signal across that primary constituting a first phase $\phi_1$ of the combined differential signal produced by phase interpolator 40$_x$. Similarly, the drains of transistors 50c3 and 50d3 are connected to opposing sides of the primary of transformer 55$_2$, and establish a second phase $\phi_2$ of the differential output signal. The secondaries of transformers 55$_1$, 55$_2$ are connected in series between a terminal at which the output signal $\phi_{out}$ appears, and ground. As such, the series connection of transformers 55$_1$, 55$_2$ performing a summing function, effectively summing the voltages induced across the secondaries of transformers 55$_1$, 55$_2$ by the operation of the pairs of transistor quads.

In this embodiment, the magnetic coupling of transformers 55$_1$, 55$_2$ constitute one part of the gains α, β applied to the in-phase and quadrature-phase components of the combined signal The differential voltages V1–V2 and V3–V4 constitute the other part of those gains. More specifically, with phase interpolator 40$_x$ configured as a phase shifter, one may consider the gains α, β as the product of the coupling factors $\alpha_0$, $\beta_0$ of transformers $55_1$, $55_2$, respectively, and a term proportional to the differential voltages V1–V2, V3–V4, respectively:

$$\alpha = \alpha_0 k(V1-V2)$$

$$\beta = \beta_0 k(V3-V4)$$

where k is a proportionality constant. In one application of phase interpolator $40_x$, the coupling factors $\alpha_0$, $\beta_0$ of transformers $55_1$, $55_2$ constitute the larger portion of the overall respective gains $\alpha$, $\beta$, i.e. a coarse phase shift control, while the differential voltages apply a finer adjustment to arrive at the overall gains $\alpha$, $\beta$. Of course, the proportion of coupling factors $\alpha_0$, $b_0$ to the differential voltages in setting the overall gains $\alpha$, $\beta$ may vary as desired.

The operation of phase interpolator $40_x$ will be similar to that described above in connection with phase interpolator $20_x$. As before, referring to the first pair of transistors in the left-hand quad of FIG. 5, the periodic signal VCO_0°, controls the currents conducted by tail transistors 52a, 52b, each of which is the sum of the currents conducted by its respective transistor pair 50a1/2, 50b1/2. The differential voltage between voltages V1, V2 from DACs 22 control the differential currents conducted by transistor 50a1 relative to transistor 50a2, and conducted by transistor 50b1 relative to transistor 50b2, that contribute to those sum currents conducted by tail transistors 52a, 52b. The differential between voltages V1, V2 thus determines the magnitude of the current $\phi_1$ conducted through the primary of transformer $55_1$, which in this phase shifter configuration will be at the RF frequency determined by VCO 12I. The voltage induced in the primary of transformer $55_1$ by that current will be coupled to the secondary of transformer $55_1$ according to the coupling $\alpha_0$, and summed with the induced voltage across the secondary of transformer $55_2$ by the operation of the other quad.

Similarly, the periodic signals VCO_90° and VCO_270° control the currents conducted by tail transistor 52c, 52d, and thus the sums of the currents conducted by associated transistor pairs 50c3/4, 50d3/4, and the differential voltage between voltages V3, V4 controls the differential currents conducted by those transistors in the right-hand quad, and thus the amplitude of the quadrature-phase current $\phi_2$ through the primary of transformer $55_2$. The voltage induced in the primary of transformer $55_2$ couples to the secondary of transformer $55_2$ according to the coupling $\beta_0$, and is summed with the induced voltage across the secondary of transformer $55_1$ to constitute the output signal $\phi_{out}$.

Phase interpolator $40_x$ of this embodiment of the invention may alternatively be configured as a frequency mixer, by the application of periodic signals at a selected frequency, such as a baseband frequency of a modulating signal, as voltages V1(t), V2(t), V3(t), V4(t), such as described above in connection with the mixer architecture of FIG. 2b. As before, in this mixer configuration, voltages V3(t) and V4(t) will be at a phase angle (e.g., 90°) relative to voltages V1(t) and V2(t).

It is contemplated that transformers $55_1$, $55_2$ of phase interpolator $40_x$ may be realized by any number of conventional approaches, including as a transformer integrated into the same integrated circuit in which the rest of phase interpolator $40_x$ is realized, or alternatively as an external component to that integrated circuit. For relatively high frequencies, such as in the RF bands, it is contemplated that the inductor sizes will typically be small enough as to be compatible with formation in an integrated circuit.

In specific embodiments, particular implementations of transformers $55_1$, $55_2$ for use in phase interpolator $40_x$ are contemplated. One implementation that is contemplated to be particularly area-efficient is illustrated in FIG. 6a, which is a schematic diagram of a plan view of a portion of an integrated circuit at which transformers $55_1$, $55_2$ is realized. In this arrangement, conductor $55_{1P}$ is formed in one level of metallization of the integrated circuit, and is formed as a rectangular loop that is connected, at terminal ends, to the drains of transistors 50a1, 50b1 so as to receive the current $\phi_1$ produced by the left-hand quad of FIG. 5. Conductor $55_{2P}$ is similarly formed as a rectangular loop, but in a different level of metallization of the integrated circuit from that of conductor $55_{1P}$, and overlying (or underlying) conductor $55_{1P}$. Terminal ends of conductor $55_{2P}$ are connected to the drains of transistors 50c3, 50d3 to receive the current $\phi_2$ produced by the right-hand quad of FIG. 5. In this embodiment, conductor $55_{2dary}$ is formed in a different metallization level from that of conductors $55_{1P}$, $55_{2P}$, and overlies, underlies, or is disposed between conductors $55_{1P}$, $55_{2P}$. In this embodiment, conductor $55_{2dary}$ has a shape so as to have segments parallel with segments of each of conductors $55_{1P}$, $55_{2P}$. In this example, conductor $55_{2dary}$ is octagonal, although other polygonal shapes are contemplated. One of the terminal ends of conductor $55_{2dary}$ is connected to ground, and output signal $\phi_{out}$ will appear at the other.

The structure of FIG. 6a operates as transformers $55_1$, $55_2$ of phase interpolator $40_x$. However, the placement of conductors $55_{1P}$, $55_{2P}$, relative to one another, is arranged so that conductors $55_{1P}$, $55_{2P}$ are perpendicular at their points of intersection (in the "x-y" plane in the view of FIG. 6a). In addition, currents $\phi_1$, $\phi_2$ have a relative phase of 90° relative to one another. These factors limit, if not eliminate, significant coupling between conductors $55_{1P}$, $55_{2P}$. As a result, any coupling of current $\phi_1$ conducted by conductor $55_{1P}$ to conductor $55_{2P}$ will not significantly affect the orthogonal current $\phi_2$, and vice versa, retaining the accuracy of the phase shift already obtained from phase interpolation. However, because conductor $55_{2dary}$ has segments parallel with and near to segments of each of conductors $55_{1P}$, $55_{2P}$, each of the currents $\phi_1$, $\phi_2$ through conductors $55_{1P}$ and $55_{2P}$ will couple to conductor $55_{2dary}$, inducing a voltage in output signal $\phi_{out}$.

As known in the art, the inductive coupling between parallel wire segments varies proportionally with the distance over which the wires are parallel to one another, and varies inversely with the distance between those wires. Accordingly, the magnitude of inductive coupling between conductors $55_{1P}$ and $55_{2P}$ and conductor $55_{2dary}$ will depend on the lengths of and relative distances (e.g., distances $d_1$ and $d_2$ of FIG. 6a) between parallel segments of those conductors. As such, the coupling factors $\alpha_0$, $\beta_0$ of transformers $55_1$, $55_2$ can be established by the layout of conductors $55_{1P}$ and $55_{2P}$ and conductor $55_{2dary}$, specifically the lengths and separations of parallel segments among those conductors. This layout should consider the extent to which these coupling factors $\alpha_0$, $\beta_0$ of transformers $55_1$, $55_2$, as compared with the differential voltages V1–V2 and V3–V4 are to determine the overall gains $\alpha$, $\beta$. And between the layout of conductors $55_{1P}$, $55_{2P}$, and $55_{2dary}$, and the operation of DACs 22, these overall gains $\alpha$, $\beta$ are to be controlled so as to obey the relationships:

$$\forall (\alpha_0, \beta_0) \leq 1; \text{ and}$$

$$\alpha_0^2 + \beta_0^2 = 1$$

It is contemplated that those skilled in the art having reference to this specification will be readily able to lay out conductors $55_{1P}$, $55_{2P}$, and $55_{2dary}$, and control DACs 22 or such other circuitry used to establish the differential voltages V1–V2 and V3–V4, as to arrive at the desired operating point.

It is further contemplated that some realizations of this embodiment will provide multiple instances of conductors $55_{1P}$, $55_{2P}$, and $55_{2dary}$ with different layouts so as to define different values of coupling factors $\alpha_0$, $\beta_0$, all available to each instance of phase interpolator $40_x$. This implementation would allow selection of the particular pair of coupling factors $\alpha_0$, $\beta_0$ for each phase interpolator $40_x$, for example at a late stage of manufacture (e.g., an upper level of metallization in the integrated circuit) or even after manufacture (e.g., by way of electrical programming). As such, this embodiment can provide a wide range of flexibility to the implementation of this embodiment.

FIGS. 6b and 6c illustrate the construction of transformers $55_1$, $55_2$ according to another embodiment, again by way of a schematic diagram of a plan view of a portion of an integrated circuit. In this arrangement, transformers $55_1$, $55_2$ are realized by a bundle 55' of adjacent conductors, formed as an octagon of three metallization layers 64a, 64b, 64c that overlie one another as shown in the cross-section of FIG. 6c. In this embodiment, these metallization layers 64a, 64b, 64c are formed in different metal levels of the integrated circuit, but are in periodic electrical contact along its length. As shown in FIG. 6c, metallization layers 64a, 64b, 64c are stacked over one another, overlying semiconductor body 60 (at and into which transistors and other circuit components of the integrated circuit are formed), and insulated from one another and from semiconductor body 60 by one or more layers of insulator 62. Plugs 65 are disposed at selected locations along the length of the circular path of bundle 55', so as to electrically strap metallization layers 64a, 64b, 64c together.

In this embodiment, pre-determined tapping points 58 are provided at selected locations along the circular loop of bundle 55'. These tapping points connect to one or more of metallization layers 64a, 64b, 64c, for example to the topmost metallization layer 64c as shown in FIG. 6c. Bundle 55' is connected to ground at one end, and to terminals at which output signal $\phi_{out}$ is presented at locations substantially diametrically opposite the ground connection. In this embodiment, transistors 50a1 and 50b1 are connected to selected ones of these tapping points 58, for example across symmetric tapping points relative to the ground and output terminals as shown in FIG. 6b, at which current $\phi_1$ is applied. Similarly, transistors 50c3, 50d3 are connected to selected tapping points 58, at which current $\phi_2$ appears. If desired, currents $\phi_1$ and $\phi_2$ may be applied to different ones of metallization layers 64a, 64b, 64c from one another, and output signal $\phi_{out}$ may be presented at the one of the three layers 64a, 64b, 64c not receiving either of currents $\phi_1$ and $\phi_2$.

In this embodiment, the selection of the particular tapping points 58 at which currents $\phi_1$, $\phi_2$ appear determines the coupling factors $\alpha_0$, $\beta_0$ of transformers $55_1$, $55_2$, respectively, based on the relative distances $l_1$, $l_2$ over which currents $\phi_1$, $\phi_2$ travel to the ground terminal, relative to the overall distance l between the output signal $\phi_{out}$ terminals travel. More specifically, one can determine the coupling factors $\alpha_0$, $\beta_0$ of transformers $55_1$, $55_2$ as:

$$\alpha_0 = \frac{l_1}{l}$$

and $$\beta_0 = \frac{l_2}{l}$$

It is contemplated that this selection of tapping points 58 to attain the desired coupling factors $\alpha_0$, $\beta_0$ may be made at a late stage of manufacture (e.g., an upper level of metallization in the integrated circuit) or even after manufacture (e.g., by way of electrical programming). As such, this embodiment also can provide a wide range of flexibility to the implementation of this embodiment. Furthermore, this construction of transformers $55_1$, $55_2$ by way of bundle 55' of overlying and strapped metallization layers 64a, 64b, 64c results in each of the currents $\phi_1$ and $\phi_2$ and output signal $\phi_{out}$ being carried by an effectively thicker conductor, and thus exhibiting a lower series resistance, while still obtaining the inductive coupling of transformers $55_1$, $55_2$.

According to these embodiments, the construction and operation of phase interpolators and associated circuitry according to these embodiments can provide the important advantages of excellent linearity over their operating ranges, along with accurate, precise, and high-resolution phase shifting and frequency mixing performance. Noise suppression is excellent according to these embodiments, and the ability to compensate and calibrate over process variations is readily attainable. And because the active devices may be implemented by transistors at or near minimum feature sizes, these circuits are capable of high frequency operation such as in RF bands.

While one or more embodiments have been described in this specification, it is of course contemplated that modifications of, and alternatives to, these embodiments, such modifications and alternatives capable of obtaining one or more the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. An analog circuit for generating a periodic signal, comprising:
   oscillator circuitry for generating first and second periodic differential signals at a first frequency and at a selected phase angle relative to one another;
   at least one phase interpolator, having inputs receiving the first and second periodic differential signals, and having inputs receiving first and second differential gain signals, for generating a combined periodic signal having a frequency component corresponding to the first frequency and at a phase angle corresponding to a relationship of the first and second differential gain signals, wherein the at least one phase interpolator comprises:
   a load;
   a plurality of transistor pairs, each comprising first and second transistors, each having a conduction path and a gate, a first end of the conduction path of each of the first and second transistors connected at a common node, a second end of the conduction path of the first transistor coupled to the load, and a second end of the conduction path of the second transistor coupled to a bias voltage; and a plurality of tail transistors, each associated with one of the transistor pairs, and each having a conduction path and a gate, a first end of the conduction path coupled to the common node of an associated one of the plurality of transistor pairs, a second end of the conduction path coupled to a reference voltage;

wherein the first differential gain signal is applied across the gates of the first and second transistors in first and second ones of the transistor pairs;

wherein the second differential gain signal is applied across the gates of the first and second transistors in each of third and fourth ones of the transistor pairs;

wherein the first periodic differential signal is applied across the gates of a first tail transistor associated with the first transistor pair, and of a second tail transistor associated with the second transistor pair;

and wherein the second periodic differential signal is applied across the gates of a third tail transistor associated with the third transistor pair, and of a fourth tail transistor associated with the fourth transistor pair.

2. The circuit of claim 1, further comprising:
a plurality of digital-to-analog converters for generating the first and second differential gain signals responsive to digital data.

3. The circuit of claim 2, wherein the first and second differential gain signals are DC differential voltages.

4. The circuit of claim 3, wherein the selected phase angle of the first and second periodic differential signals is 90°.

5. The circuit of claim 4, wherein the phase angle of the combined periodic signal corresponds to the inverse tangent of a ratio of the second differential gain signal to the first differential gain signal;

and wherein the combined periodic signal is at the first frequency.

6. The circuit of claim 3, wherein the signal applied at the gate of the first tail transistor is at a phase angle of 180° from the signal applied at the gate of the second tail transistor;

and wherein the signal applied at the gate of the third tail transistor is at a phase angle of 180° from the signal applied at the gate of fourth second tail transistor.

7. The circuit of claim 2, wherein each of the plurality of digital-to-analog converters comprises:

a first conducting leg comprising a first transistor and a plurality of resistors of substantially the same resistance value, the resistors connected in series with one another and with the conduction path of the first transistor between a power supply voltage and a ground voltage, where nodes between adjacent resistors correspond to tap points; and a second conducting leg comprising a second transistor and a plurality of resistors of substantially the same resistance value, the resistors connected in series with one another and with the conduction path of the second transistor between a power supply voltage and a ground voltage, where nodes between adjacent resistors correspond to tap points;

wherein a control terminal of the first transistor receives a first reference voltage controlling the first transistor to conduct a first selected current, and a control terminal of the second transistor receives a second reference voltage controlling the second transistor to conduct a second selected current;

wherein a selected tap point in the first conducting leg and a selected tap point in the second conducting leg are connected in common to receive a common mode voltage;

wherein the first differential gain signal corresponds to a differential voltage across a selected tap point in the first conducting leg and a selected tap point in the second conducting leg of a first digital-to-analog converter;

and wherein the second differential gain signal corresponds to a differential voltage across a selected tap point in the first conducting leg and a selected tap point in the second conducting leg of a second digital-to-analog converter.

8. The circuit of claim 7, wherein the first and second reference voltages are DC voltages;

and wherein the first and second differential gain signals are DC differential voltages.

9. The circuit of claim 7, wherein the first and second reference voltages applied to the first digital-to-analog converter are periodic signals at a second frequency and at a phase angle of 180° from one another;

wherein the first and second reference voltages applied to the second digital-to-analog converter are periodic signals at a second frequency and at a phase angle of 180° from one another, and at a phase angle of 90° from the reference voltages applied to the first digital-to-analog converter;

wherein the first and second differential gain signals are periodic signals at the second frequency and at a phase angle of 90° from one another;

and wherein the combined periodic signal has a component at the first frequency and a component at the second frequency.

10. The circuit of claim 9, wherein the phase angle of the combined periodic signal corresponds to the inverse tangent of a ratio of the second differential gain signal to the first differential gain signal.

11. The circuit of claim 1, wherein the load has a first end coupled to the second end of the conduction path of a first transistor in each of the first and third transistor pairs, and a second end coupled to the second end of the conduction path of a first transistor in each of the second and fourth transistor pairs.

12. The circuit of claim 11, wherein the load comprises an inductor.

13. The circuit of claim 1, wherein the load comprises a transformer, the transformer comprising:

a first primary inductor coupled between the second end of the conduction path of the first transistor in the first transistor pair and the second end of the conduction path of the first transistor in the second transistor pair;

a second primary inductor coupled between the second end of the conduction path of the first transistor in the third transistor pair and the second end of the conduction path of the first transistor in the fourth transistor pair; and a secondary inductor connected between an output node and a reference voltage, the secondary inductor coupled to the first primary inductor according to a first coupling factor, and coupled to the second primary inductor according to a second coupling factor;

and wherein the phase angle of the combined periodic signal also corresponds to a relationship of the first and second coupling factor.

14. The circuit of claim 13, wherein the circuit is realized in an integrated circuit;

wherein the first primary conductor comprises a conductor arranged as a polygonal loop in a first metal level of the integrated circuit;

wherein the second primary conductor comprises a conductor arranged as a polygonal loop in a second metal level of the integrated circuit, one of the primary conductors having one or more segments crossing over one or more segments of the other one of the primary conductors, the crossing segments being substantially perpendicular to one another at the crossing locations;

and wherein the secondary inductor comprises a conductor arranged as a polygonal loop in a third metal level of the integrated circuit, and having segments disposed parallel to segments of each of the first and second primary conductors.

15. The circuit of claim 13, wherein the circuit is realized in an integrated circuit;

wherein the first and second primary conductors each comprise a conductor arranged as a loop in a metal level of the integrated circuit, each having a plurality of connection tap points at which transistors in the phase interpolator may be selectively coupled;

and wherein the secondary inductor comprises a conductor arranged as a loop in a metal level of the integrated circuit, the loop running near to and substantially parallel to lengths of the first and second primary conductors.

16. The circuit of claim 1, wherein the at least one phase interpolator comprises a plurality of phase interpolators;

and wherein the phase angles of the generated combined periodic signals differ among the plurality of phase interpolators.

17. A method of generating a periodic electrical signal at a selected frequency and phase, comprising the steps of:

applying a first periodic differential signal at a first frequency across the gates of a first tail transistor and a second tail transistor;

applying a second periodic differential signal at the first frequency and at a selected phase angle relative to the first periodic differential signal across the gates of a third tail transistor and a fourth tail transistor;

applying a first differential gain signal across the gates of first and second transistors in a first transistor pair associated with the first tail transistor, and across the gates of first and second transistors in a second transistor pair associated with the second tail transistor; and applying a second differential gain signal across the gates of first and second transistors in a third transistor pair associated with the third tail transistor, and across the gates of first and second transistors in a fourth transistor pair associated with the fourth tail transistor;

wherein each of the first and second transistors in each of the first, second, third, and fourth transistor pairs has a conduction path and a gate, a first end of the conduction path of each of the first and second transistors connected to a conduction path of its associated tail transistor, a second end of the conduction path of the first transistor coupled to a load, and a second end of the conduction path of the second transistor coupled to a bias voltage;

and wherein the periodic electrical signal appears at the load, and has a phase corresponding to a relationship of the first and second differential gain signals.

18. The method of claim 17, further comprising:

converting digital data to analog values corresponding to the first and second differential gain signals.

19. The method of claim 18, further comprising:

generating first and second baseband periodic signals at a baseband frequency and a selected phase angle relative to one another; and generating the first and second differential gain signals responsive to the first and second baseband periodic signals and to the converted analog values.

20. The method of claim 17, wherein the load comprises a first primary inductor coupled across the first transistors of the first and second transistor pairs, a second primary inductor coupled across the first transistors of the third and fourth transistor pairs, and a secondary inductor coupled to the first primary inductor according to a first coupling factor, and coupled to the second primary inductor according to a second coupling factor;

and wherein the phase angle of the combined periodic signal also corresponds to a relationship of the first and second coupling factor.

* * * * *